US005658820A

United States Patent [19]

Chung

[11] Patent Number: 5,658,820
[45] Date of Patent: Aug. 19, 1997

[54] METHOD FOR MANUFACTURING FERROELECTRIC THIN-FILM CAPACITOR

[75] Inventor: Chee-won Chung, Seoul, Rep. of Korea

[73] Assignee: Samsung Electronics Co., Ltd., Rep. of Korea

[21] Appl. No.: 616,491

[22] Filed: Mar. 19, 1996

[30] Foreign Application Priority Data

Mar. 20, 1995 [KR] Rep. of Korea ............ 95-5784

[51] Int. Cl.$^6$ ............ H01L 21/70; H01L 27/00
[52] U.S. Cl. ............ 438/3; 438/396; 438/720; 438/722; 438/6
[58] Field of Search ............ 437/60, 52, 919; 156/646.1

[56] References Cited

U.S. PATENT DOCUMENTS

| 4,759,823 | 7/1988 | Asselanis et al. | 156/659.1 |
| 5,046,043 | 9/1991 | Miller et al. | 365/145 |
| 5,081,559 | 1/1992 | Fazan et al. | 361/313 |

*Primary Examiner*—Jey Tsai
*Attorney, Agent, or Firm*—Rothwell, Figg, Ernst & Kurz, P.C.

[57] ABSTRACT

A method for manufacturing ferroelectric thin-film which is used as a memory cell for an FRAM includes the steps of: (a) forming a lower electrode, a ferroelectric thin-film and an upper Pt electrode on a substrate in sequence; (b) forming a photoresist on the upper Pt electrode; (c) patterning the photoresist in a predetermined pattern; and (d) etching the substrate, the step (d) including the steps of installing a holder to which a predetermined DC self bias voltage is generated in a chamber of a plasma etching apparatus around which an RF coil is wound, of injecting Ar, chloric and fluoric gases of a predetermined composition ratio into the chamber, of applying a RF power of a predetermined frequency and power to the RF coil to generate an inductively coupled plasma in the chamber, and of etching down the substrate from the upper Pt electrode to the ferroelectric thin-film to a predetermined depth by the plasma of the Ar, chloric and fluoric gases using the photoresist as a mask. As a result, the etching rate of a ferroelectric thin-film and electrode is sharply increased, and particularly, the etching selectivity of the ferroelectric thin-film and electrode with respect to the photoresist is improved, so that the photoresist can be used as a mask.

21 Claims, 9 Drawing Sheets

METHOD FOR MANUFACTURING FERROELECTRIC THIN-FILM CAPACITOR

BACKGROUND OF THE INVENTION

The present invention relates to a method for manufacturing a capacitor having a ferroelectric thin-film, and more particularly, to a method for manufacturing a ferroelectric thin-film capacitor, which is used as a memory cell of a ferroelectric random access memory (FRAM).

A ferroelectric capacitor comprises upper and lower electrodes having good conductivity for transferring a charge and a ferroelectric thin-film disposed between the electrodes. In a capacitor having a ferroelectric thin-film, a lower electrode is first formed on a substrate, and then the ferroelectric thin-film is coated thereon. Thereafter, an upper electrode is formed on the resultant structure and then processed as a predetermined pattern. For processing the upper electrode, a mask is formed on the upper electrode through a photolithography process and then a part of the electrode, which is not covered with the mask, is etched. As the etching method, there are wet etching, ion beam etching, reactive ion etching, reactive ion beam etching, etc. However, in the case of the ion beam etching, the reactive ion etching or the reactive ion beam etching, ions come to be concentrated in the upper electrode, the underlying ferroelectric thin-film and/or the interfaces thereof, to thereby cause a charging phenomenon in which a coercive current increases.

Generally, the reactive ion etching method is used for processing the ferroelectric thin-film and the ion beam etching method in which the electrode is physically processed using inert gas is used for processing the electrode. In the ion etching method, an etching rate is slow due to a low plasma density and the capacitor is damaged by the physical impact of the ions and the charging effect thereof. On the other hand, in the reactive ion etching method which is widely used for processing the ferroelectric thin-film, a metal mask should be applied since the etching rate is slow in this case and a selectivity with respect to a photoresist which is mainly used as a mask is very low. Therefore, a new etching method in which a very high etching rate and high selectivity are provided is required for processing the ferroelectric thin-film and electrode.

SUMMARY OF THE INVENTION

It is an object of the present invention to provide a method for manufacturing a high-density ferroelectric thin-film capacitor in which the etching rates of a ferroelectric thin-film and an electrode are improved and selectivity with respect to each is increased and selectivity of both of the ferroelectric thin-film and the electrode with respect to a photoresist is also increased.

To achieve the above object, there is provided a method for manufacturing a ferroelectric thin-film capacitor, the method comprising the steps of: (a) forming a lower electrode, a ferroelectric thin-film and an upper Pt electrode on a substrate in sequence; (b) forming a photoresist on the upper Pt electrode; (c) patterning the photoresist in a predetermined pattern; and (d) etching the substrate, the step (d) including the steps of installing a holder to which a predetermined DC self bias voltage is generated in a chamber of a plasma etching apparatus around which an RF coil is wound, of injecting Ar, chloric and fluoric gases of a predetermined composition ratio into the chamber, of applying an RF power of a predetermined frequency and power to the RF coil to generate an inductively coupled plasma in the chamber, and of etching down the substrate to a predetermined depth by the plasma of the Ar, chloric and fluoric gases using the photoresist as a mask.

Also, there is provided a method for manufacturing a ferroelectric thin-film capacitor comprising the steps of: (a) providing a chamber; (b) providing means for generating magnetic field, wherein the means surrounds the chamber; (c) providing a substrate holder in the chamber; (d) mounting a ferroelectric capacitor on the substrate holder, the ferroelectric capacitor comprising a Si substrate, a $SiO_2$ layer formed on the Si substrate, a lower Pt electrode formed on the $SiO_2$ layer, a lower oxide electrode on the lower Pt electrode, a ferroelectric layer formed on the lower Pt electrode, an upper oxide electrode formed on the lower Pt electrode, an upper Pt electrode formed on the ferroelectric layer, and a patterned photoresist mask formed on the upper Pt electrode; (e) sealing and evacuating the chamber sequentially; (f) inserting Ar, chloric and fluoric gases into the chamber; (g) applying a first RF power to the means for generating magnetic field, for generating plasma in the chamber; and (h) etching the part of ferroelectric capacitor by using the plasma, which is not covered with the pattered photoresist mask.

In addition, there is provided a method for manufacturing a ferroelectric thin-film capacitor comprising the steps of: (a) providing a chamber; (b) providing means for generating magnetic field, wherein the means surrounds the chamber; (c) providing a substrate holder in the chamber; (d) mounting a ferroelectric capacitor on the substrate holder, the ferroelectric capacitor comprising a Si substrate, a $SiO_2$ layer formed on the Si substrate, a lower Pt electrode formed on the $SiO_2$ layer, a lower oxide electrode on the lower Pt electrode, a ferroelectric layer formed on the lower Pt electrode, an upper oxide electrode formed on the lower Pt electrode, an upper Pt electrode formed on the ferroelectric layer, and a patterned photoresist mask formed on the upper Pt electrode; (e) sealing and evacuating the chamber sequentially; (f) inserting Ar, chloric and fluoric gases into the chamber; (g) applying a first RF power to means for generating magnetic field, for generating plasma in the chamber; and (h) etching the part of ferroelectric capacitor by using the plasma, which is not covered with the pattered photoresist mask.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

In a method for manufacturing a ferroelectric thin-film capacitor, the process steps thereof according to the present invention are the following.

Figure 1:
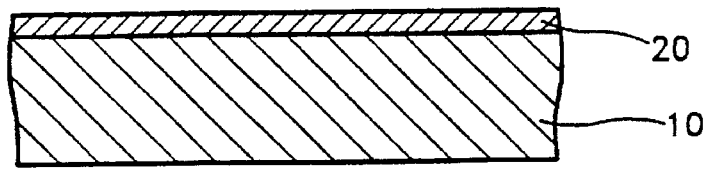
FIGS. 1 to 7 are diagrams showing the manufacturing process according to the present invention.

As shown in FIG. 1, a $SiO_2$ insulating layer 20 is formed on a silicon substrate 10. The insulating layer 20 provides electrical insulation for an underlying element such as a transistor (not shown) required by an FRAM.

Figure 2:
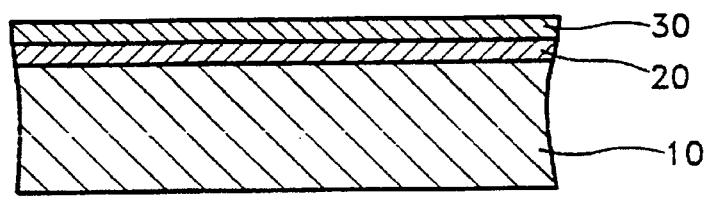

When the insulating layer 20 is formed, an adhesive layer 30 for increasing the adhesiveness of a lower electrode 40 of platinum (Pt, described later) is formed with a material such as titanium (Ti), as shown in FIG. 2.

Figure 3:
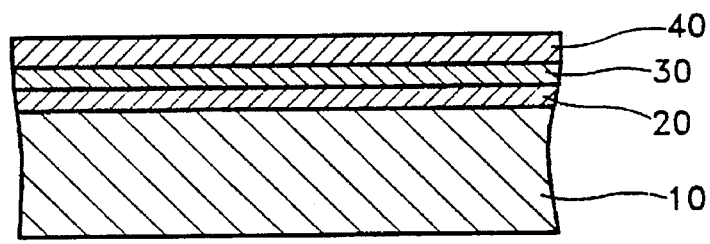

As shown in FIG. 3, the lower electrode 40 is formed on the adhesive layer 30 by evaporating Pt thereon. Here, generally, a DC magnetron sputtering evaporation method is used to form the lower electrode 40.

Figure 4:
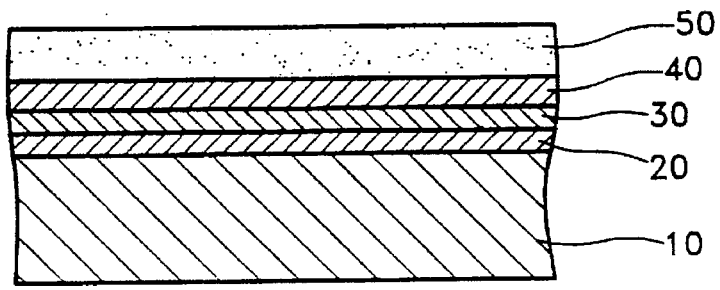

As shown in FIG. 4, a ferroelectric thin-film 50 is formed on the lower electrode 40. The ferroelectric thin-film 50 may be made of PZT ($PbZr_xTi_{1-x}O_3$), Y1 series ($SrBi_2Ta_2O_9$), BST ($Ba_xSr_{1-x}TiO_3$) or similar material and a sol-gel method is used in a stacking process. In the stacking process, first, ferroelectric solution is deposited by using a spin coater, and then, a baking process is repeated several times at a predetermined temperature, and finally, an annealing process is performed to produce the intended ferroelectric thin-film.

Figure 5:
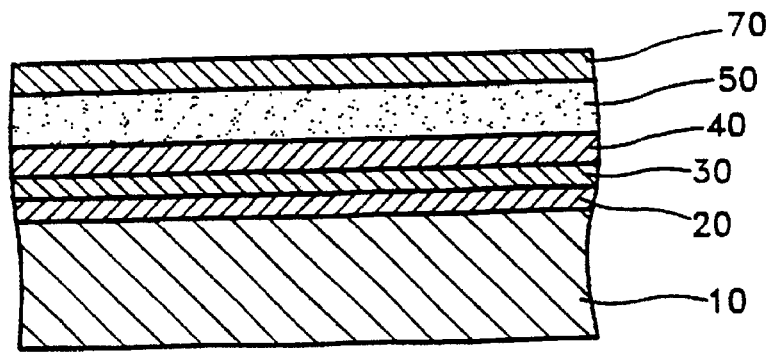

As shown in FIG. 5, an upper electrode 60 of Pt is formed on the ferroelectric thin-film 50. Here, the upper electrode 60 is formed by the evaporation method used in the same process for forming the lower electrode 40.

Figure 6:
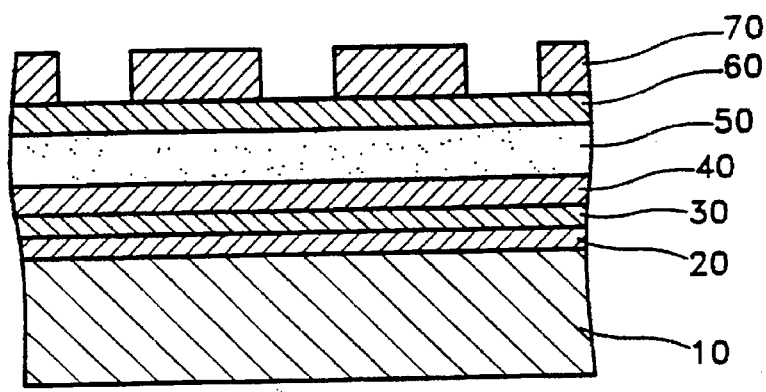

When the upper electrode 60 is completely formed, first, a photoresist layer 70 is formed for performing a patterning process using photolithography, as shown in FIG. 6. Then, the photoresist layer 70 is patterned, to thereby produce an intended shape.

Figure 7:
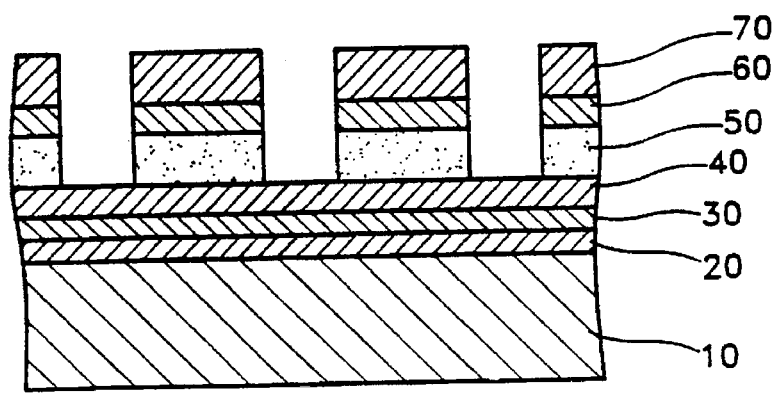

As shown in FIG. 7, according to an etching method in which an inductively coupled high-density plasma is used, the etching process is performed from the upper electrode 60 to the ferroelectric thin-film 50 formed on the lower electrode 40 by using the patterned photoresist layer 70, to thereby obtain the intended capacitor. In the above structure, a conductive oxide electrode such as $RuO_x$ electrode may be interposed between the ferroelectric thin-film 50, and the lower and upper electrodes 40 and 60. As a reaction gas, a gas mixed from chloric and fluoric gases is used. Here, the fluobic gas includes $CF_4$, $CHF_3$ and $C_2F_6$, and the chloric gas includes $CCl_2F_4$ and $CHClFCF_3$. However, it is preferable to use a gas mixed with $Cl_2$ and $C_2F_6$ as the reaction gas.

Experimental results were obtained through the etching method in which an inductively coupled high-density plasma is used.

In the etching method, first, a substrate as an etching object is disposed on a holder in a plasma etching apparatus. Here, the holder temperature is maintained as 10° C. First, a chamber used for plasma etching is maintained as a vacuum state and then gases such as Ar, $C_2F_6$ and $Cl_2$ are injected into the chamber to generate the plasma. Then, the etching process is performed. Here, a RF power of 13.56 MHz is applied to a magnetic field generating device, that is, an RF coil, surrounding the chamber, with a power of about 600 W. Here, the DC self bias voltage of the holder is -300 V. As is well known, as the bias voltage of the holder, a second RF power may be applied to the holder and thereby DC self bias voltage as above is inherently applied thereto, or not. On the other hand, it is preferable that the chamber is under the electrical floating state and that the density of plasma is $10^{11}/cm^3$.

Figure 8:
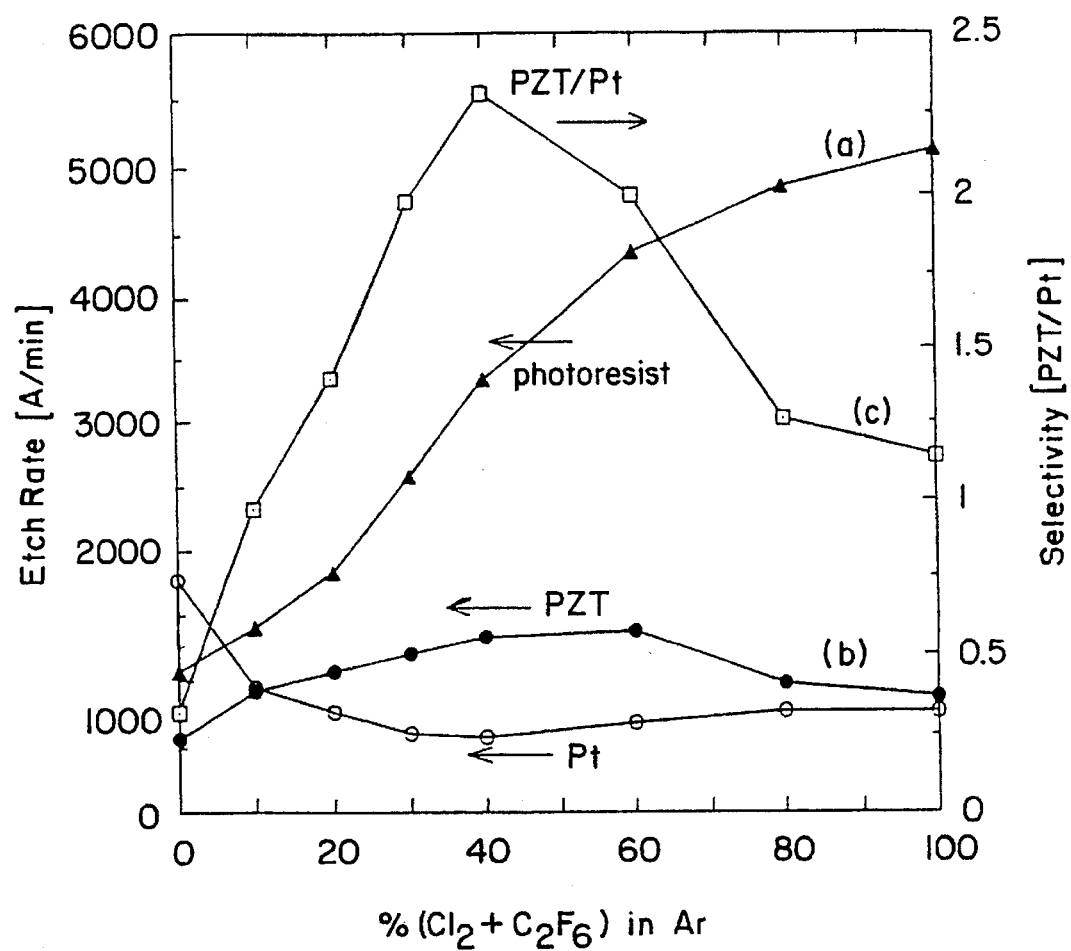
FIG. 8 is a graph showing the etching rate of each layer according to the changes in the reactive gas content ratio.

FIG. 8 shows the etching rate of each layer according to the changes in the reactive gas content ratio. Here, the total gas is 25 sccm and the ratio of $Cl_2$ to $C_2F_6$ is 3:2, while the composition ratio of these two gases to Ar is varied. In FIG. 8, (a) represents the change of the etching rate of photoresist, (b) represents the change of the etching rate of PZT thin-film, and (c) represents the change of the etching rate of the lower Pt electrode. (These reference characters represent the same conditions in each of the following FIGS. 9 to 14.) As shown in this graph, the etching rate of Pt electrode is the highest as pure Ar gas is used, and the etching rate of PZT thin-film is the highest as the ratio of the $Cl_2$ and $C_2F_6$ content to Ar content is about 60%. Also, the selectivity of PZT thin-film to Pt electrode is the highest as the ratio of the $Cl_2$ and $C_2F_6$ content to Ar content is about 40%. Also, as the ratio of the $Cl_2$ and $C_2F_6$ content to Ar content is below 10%, the etching rate of Pt electrode is higher than that of PZT thin-film.

Figure 9:
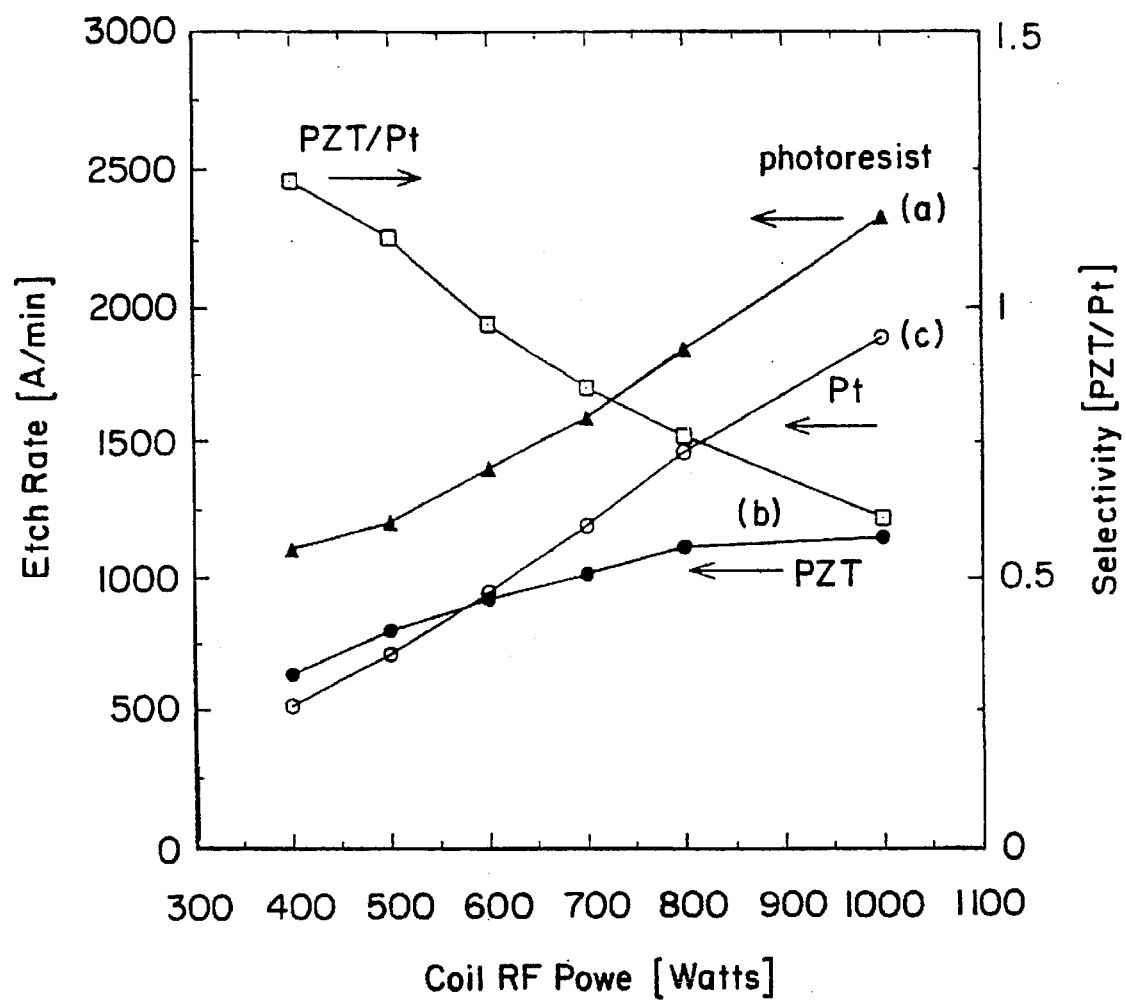
FIG. 9 is a graph showing the etching rate versus power applied to an RF coil as the ratio of $Cl_2$ and $C_2F_6$ content, mixed with a ratio of 3:2, to Ar content is 10%.

FIG. 9 shows the etching rate versus power applied to the RF coil as the ratio of $Cl_2$ and $C_2F_6$ content, mixed with a ratio of 3:2, to Ar content is 10%. As shown in FIG. 9, the etching rates of the lower Pt electrode and PZT thin-film increase as the power applied to the RF coil increases. Here, the increase in the etching rate of the Pt electrode is faster than that of the PZT thin-film. Thus, the selectivity of the PZT thin-film with respect to the Pt electrode is gradually decreased. Also, as the RF power of greater than 600 W is applied, the etching rage of Pt electrode is higher than that of PZT thin-film.

Figure 10:
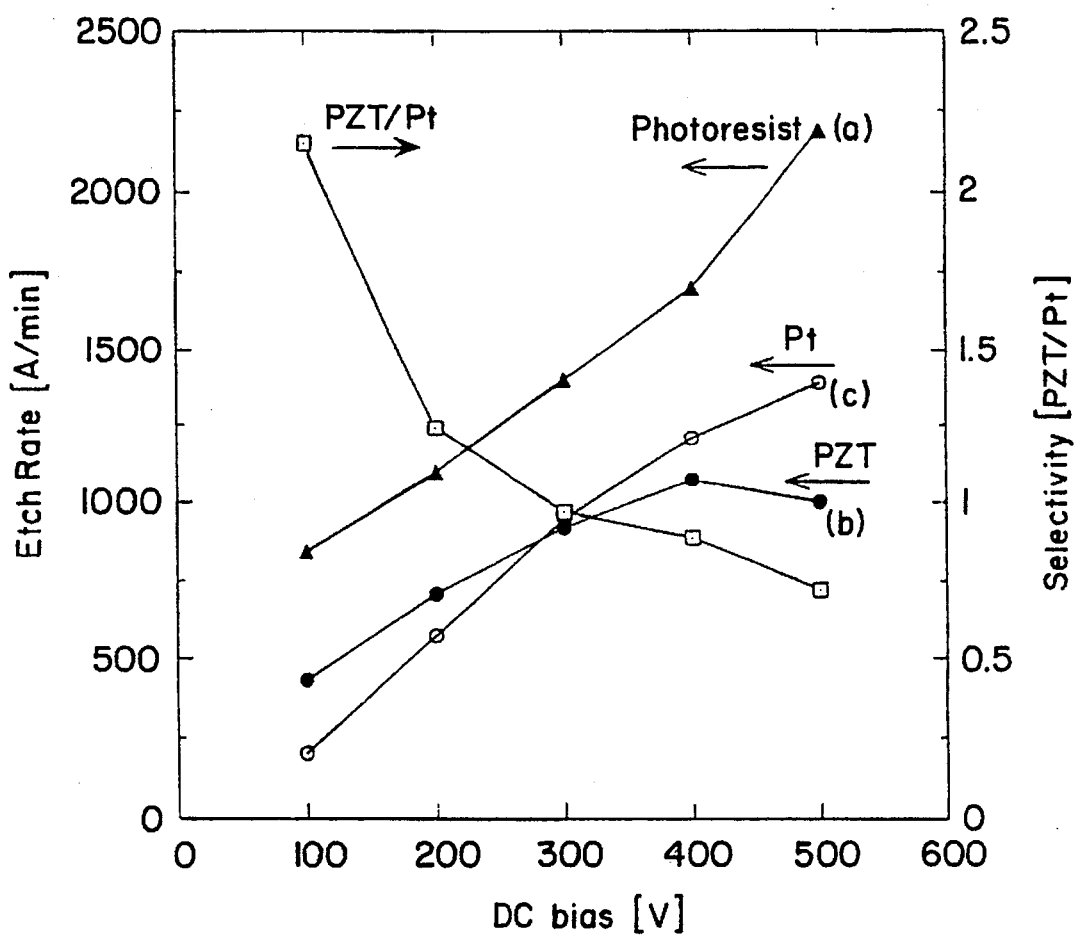
FIG. 10 is a graph showing the etching rate versus bias voltage of a holder as the ratio of $Cl_2$ and $C_2F_6$ content, mixed with a ratio of 3:2, to Ar content is 10%.

FIG. 10 shows the etching rate versus bias voltage of a holder as the ratio of $Cl_2$ and $C_2F_6$ content, mixed with a ratio of 3:2, to Ar content is 10%. As shown in FIG. 10, the etching rates of Pt electrode and PZT thin-film are similar at bias voltage of about 300 V. Also, the etching rate of the Pt electrode increases and the selectivity of the PZT thin-film with respect to the Pt electrode decreases as the DC self bias voltage increases to above 300 V.

Figure 11:
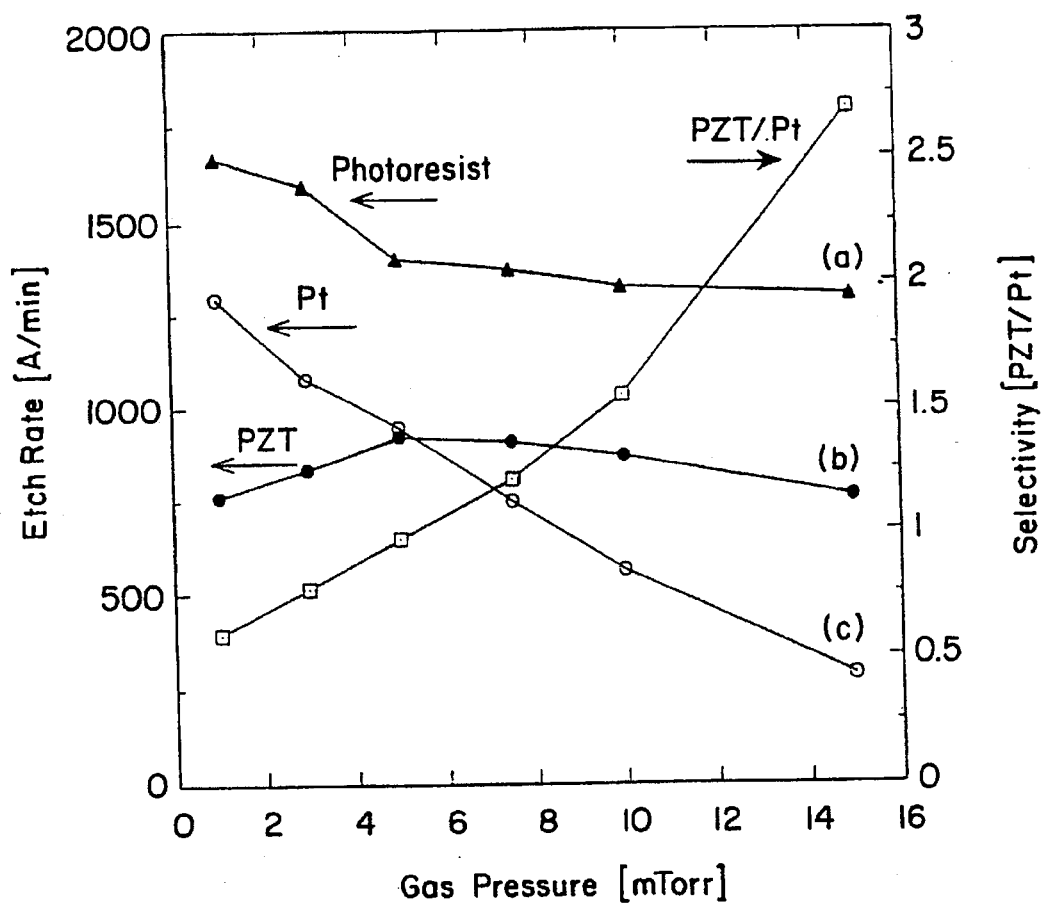
FIG. 11 is a graph showing the etching rate versus gas pressure as the ratio of $Cl_2$ and $C_2F_6$ content, mixed with a ratio of 3:2, to Ar content is 10%.

On the other hand, FIG. 11 shows the etching rate versus gas pressure. Here, the gas composition ratio of $Ar:Cl_2:C_2F_6$ is 22.5:1.5:1 (sccm), the power applied to the RF coil is 600 W and the DC self bias voltage of the holder is -300 V. As shown in FIG. 11, the etching rate of the Pt electrode is sharply decreased as the gas pressure increases. However, there is little variation of the etching rate in the PZT thin-film.

Summing up the above experimental results of the first embodiment, in the manufacturing of a capacitor having a ferroelectric thin-film of Pt/PZT/Pt, the optimum conditions for increasing the selectivity of the Pt electrode with respect to the PZT thin-film so as to etch the upper Pt electrode are: a power of the coil of greater than 600 W, a DC self bias voltage of above 300 V, and a gas pressure of below 5 mtorr as a $Cl_2$ and $C_2F_6$ content to the Ar content is 0–10%.

Figure 12:
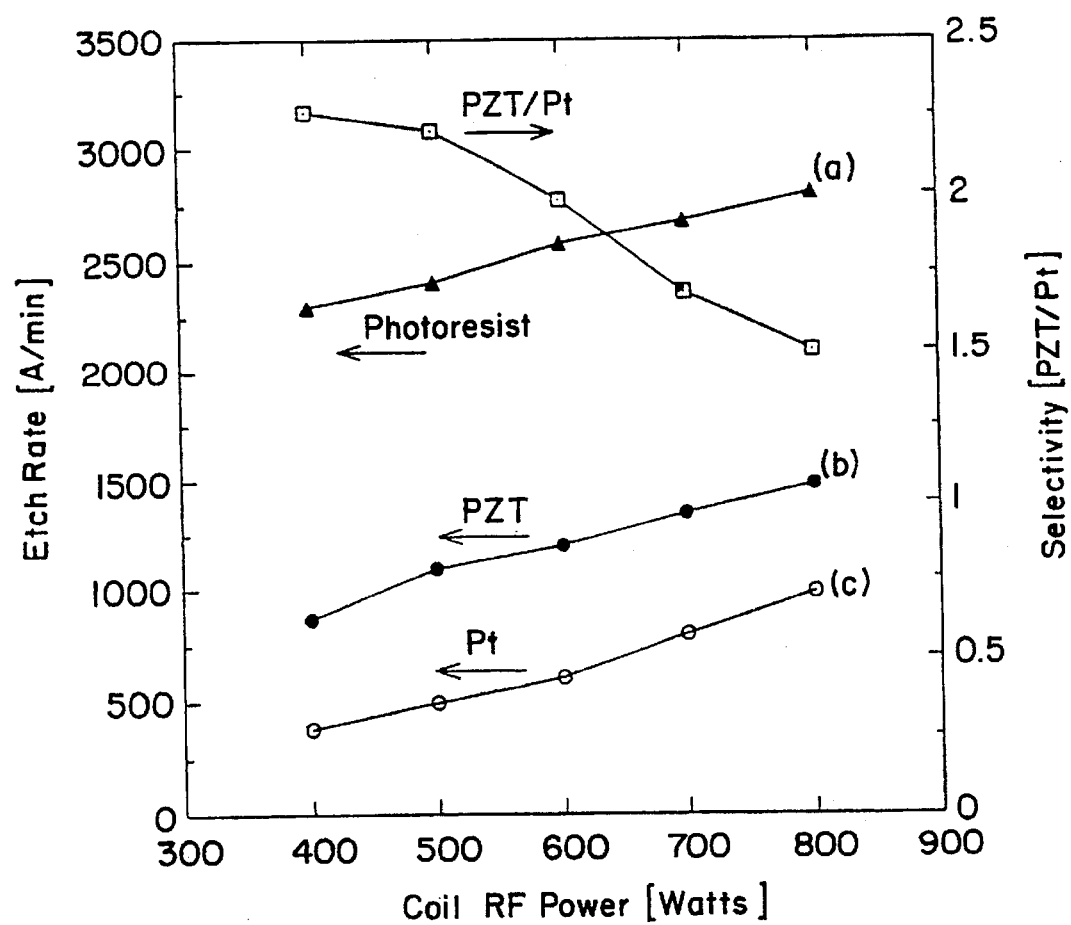
FIG. 12 is a graph showing the etching rate versus power applied to an RF coil as the ratio of $Cl_2$ and $C_2F_6$ content, mixed with a ratio of 3:2, to Ar content is 30%.
Figure 13:
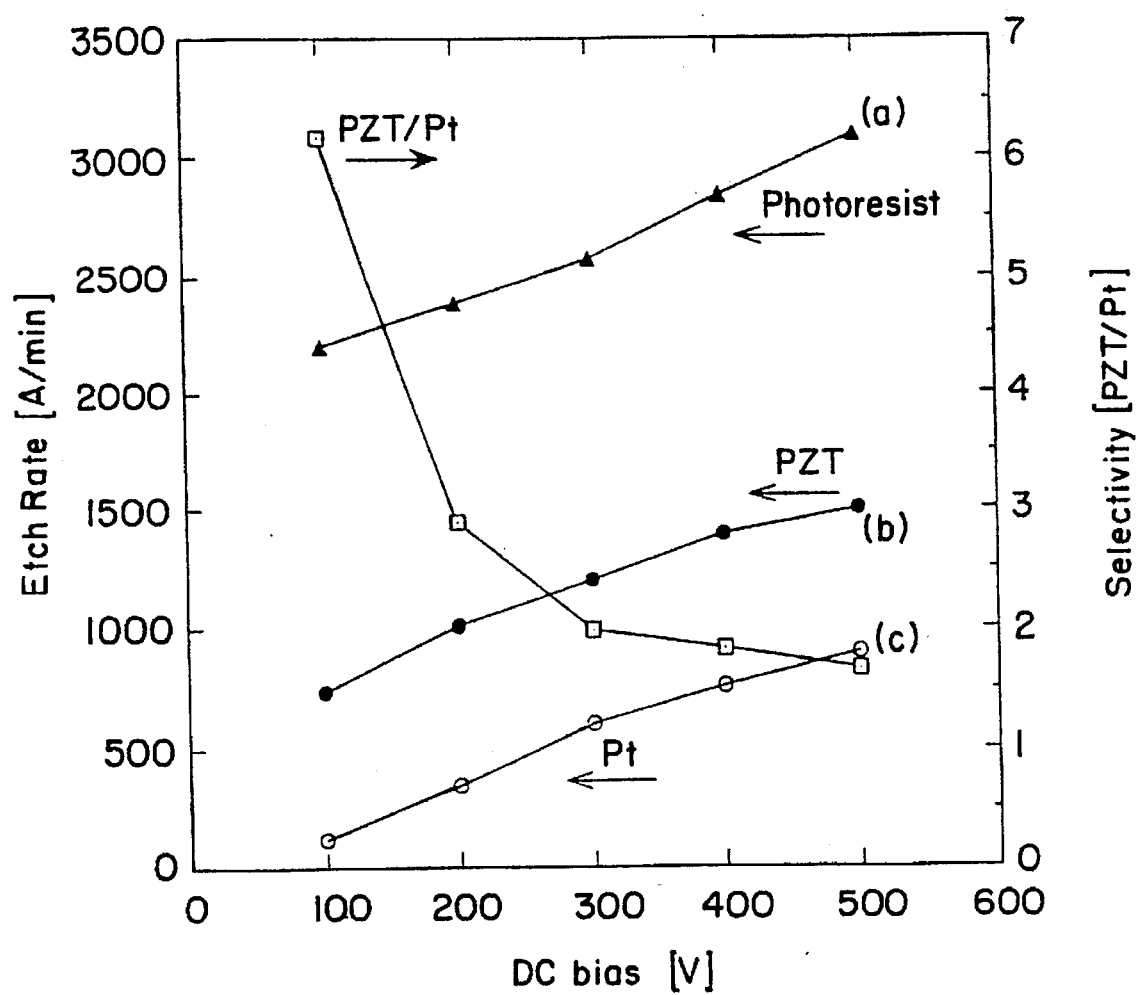
FIG. 13 is a graph showing the etching rate versus bias voltage of a holder as the ratio of $Cl_2$ and $C_2F_6$ content, mixed with a ratio of 3:2, to Ar content is 30%.
Figure 14:
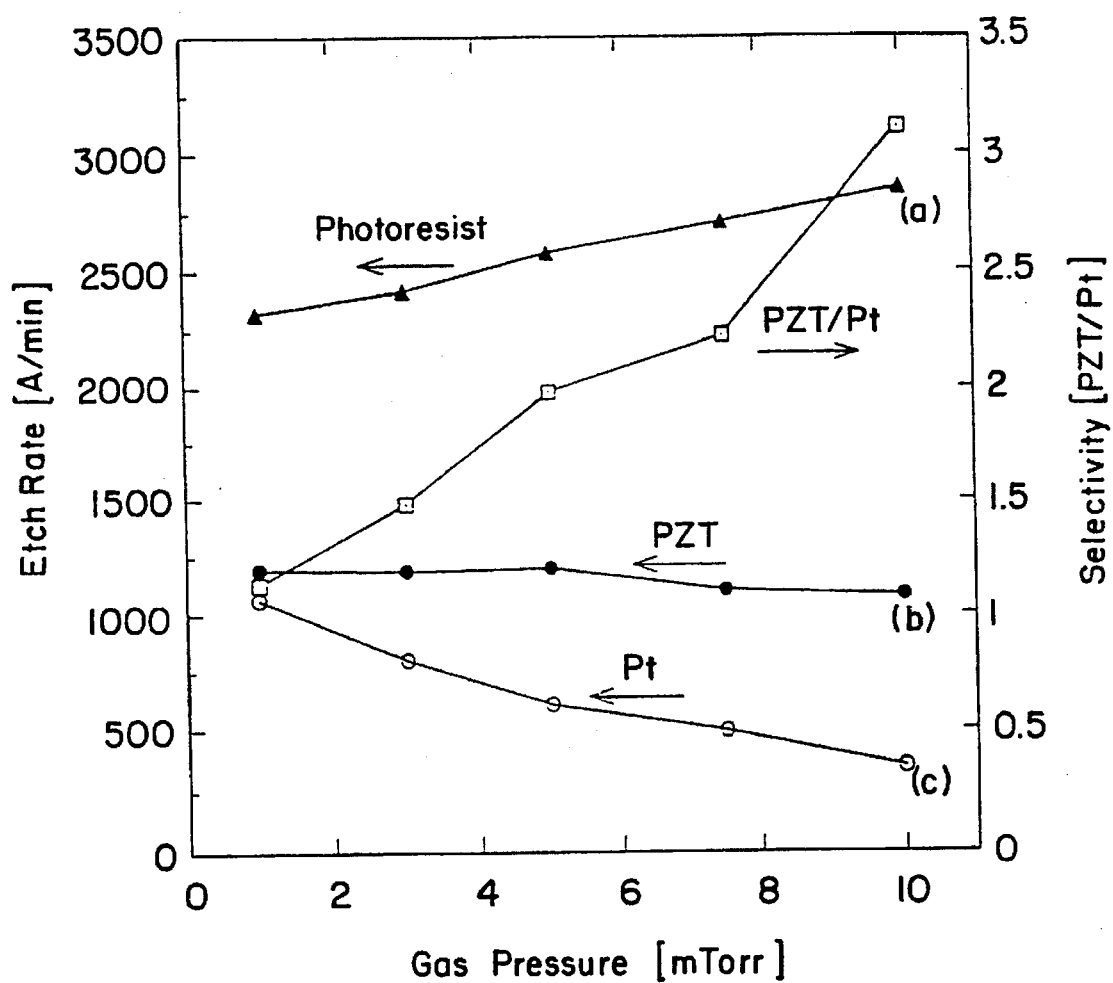
FIG. 14 is a graph showing the etching rate versus gas pressure as the ratio of $Cl_2$ and $C_2F_6$ content, mixed with a ratio of 3:2, to Ar content is 30%.

FIGS. 12 to 14 show the etching rates as the ratio of $Cl_2$ and $C_2F_6$ content to Ar content is 30%. FIG. 12 shows the etching rate versus power applied to the RF coil. As shown in FIG. 12, the etching rates of the PZT thin-film and the Pt electrode increase as the power applied to the RF coil increases. On the contrary, the selectivity of the PZT thin-film with respect to the Pt electrode decreases.

FIG. 13 shows the etching rate versus DC bias voltage of a holder. As shown in FIG. 13, the etching rates of the PZT thin-film and the Pt electrode are increased and the selectivity of the PZT thin-film with respect to the Pt electrode is decreased as the DC self bias voltage increases.

FIG. 14 shows the etching rate versus gas pressure. As shown in FIG. 14, as the gas pressure increases, the etching rate of the PZT thin-film is gradually decreased. However, the etching rate of the Pt electrode is sharply decreased and the selectivity of the PZT thin-film with respect to the Pt electrode is increased.

Summing up the above experimental results of the second embodiment, the optimum etching conditions are: a power of the coil of below 600 W, a DC self bias voltage of below 500 V, and a gas pressure of above 5 mtorr as a $Cl_2$ and $C_2F_6$ content to the Ar content is 30–40%.

In the above described method for manufacturing a ferroelectric thin-film according to the present invention, the etching rates of the ferroelectric thin-film and electrode are sharply increased, and particularly, the selectivity of ferroelectric thin-film and electrode with respect to the photoresist is improved, so that the photoresist can be used as a mask.

What is claimed is:

1. A method for manufacturing a ferroelectric thin-film capacitor, said method comprising the steps of:
   (a) forming a lower electrode, a ferroelectric thin-film and an upper Pt electrode on a substrate in sequence;
   (b) forming a photoresist on said upper Pt electrode;
   (c) patterning said photoresist in a pattern; and
   (d) etching said substrate, said step (d) including the steps of installing a holder to which a DC self bias voltage is generated in a chamber of a plasma etching apparatus around which an RF coil is wound, of injecting At, chloric and fluoric gases of a composition ratio into the chamber, of applying a RF power of a frequency and power to said RF coil to generate an inductively coupled plasma in said chamber, and of etching down said substrate to a depth by said plasma of said Ar, chloric and fluoric gases using the photoresist as a mask.

2. A method for manufacturing a ferroelectric thin-film capacitor as claimed in claim 1, wherein said ferroelectric thin-film is made of PZT.

3. A method for manufacturing a ferroelectric thin-film capacitor as claimed in claim 1, wherein the frequency of said RF power is 13.56 MHz.

4. A method for manufacturing a ferroelectric thin-film capacitor as claimed in claim 1, wherein said chloric gas includes at least one of $Cl_2$, $BCl^3$, $CCl_4$ and $SiCl_4$.

5. A method for manufacturing a ferroelectric thin-film capacitor as claimed in claim 1, wherein said fluoric gas includes at least one of $CF_4$, $CHF_3$, $C_2F_6$, $CCl_2F_2$ and $CHClFCF_3$.

6. A method for manufacturing a ferroelectric thin-film capacitor as claimed in claim 1, wherein the etching conditions of at least one of said Pt electrodes are: a power of the RF coil of greater than 600 W, a DC self bias voltage of greater than 300 V, and a gas pressure in the chamber of less than 5 mTorr as a $Cl_2$ and $C_2F_6$ content to Ar content is 0–10%.

7. A method for manufacturing a ferroelectric thin-film capacitor as claimed in claim 1, wherein the etching conditions of said ferroelectric thin-film are: a power of the RF coil of less than 600 W, a DC self bias voltage of less than 500 V, and a gas pressure in the chamber of greater than 5 mTorr as a $Cl_2$ and $C_2F_6$ content to Ar content is 30–40%.

8. A method for manufacturing a ferroelectric thin-film capacitor comprising the steps of:
   (a) providing a chamber;
   (b) providing means for generating magnetic field, wherein said means surrounds said chamber;
   (c) providing a substrate holder in said chamber;
   (d) mounting a ferroelectric capacitor on said substrate holder, said ferroelectric capacitor comprising a Si substrate, a $SiO_2$ layer formed on said Si substrate, a lower Pt electrode formed on said $SiO_2$ layer, a lower oxide electrode on said lower Pt electrode, a ferroelectric layer formed on said lower Pt electrode, an upper oxide electrode formed on said lower Pt electrode, an upper Pt electrode formed on said ferroelectric layer, and a patterned photoresist mask formed on said upper Pt electrode;
   (e) sealing and evacuating said chamber sequentially;
   (f) inserting Ar, chloric and fluoric gases into said chamber;
   (g) applying a first RF power to said means for generating magnetic field, for generating plasma in said chamber; and
   (h) etching a part of ferroelectric capacitor by using said plasma, which is not covered with said pattered photoresist mask.

9. A method for manufacturing a ferroelectric thin-film capacitor as claimed in claim 8, wherein said chamber is under the electrically floating state.

10. A method for manufacturing a ferroelectric thin-film capacitor as claimed in claim 8, wherein a second RF power is applied to said holder during said step (h), so that said holder is electrically biased by a self bias voltage inherently caused by said second RF power.

11. A method for manufacturing a ferroelectric thin-film capacitor as claimed in claim 8, wherein the etching conditions of at least one of said Pt electrodes are: a power of the RF coil of greater than 600 W, a DC self bias voltage of greater than 300 V, and a gas pressure in the chamber of less than 5 mtorr as a $Cl_2$ and $C_2F_6$ content to the Ar content is 0–10%.

12. A method for manufacturing a ferroelectric thin-film capacitor as claimed in claim 8, wherein the etching conditions of said ferroelectric thin-film capacitor are: a power of a RF coil of less than 600 W, a DC self bias voltage of less than 500 V, and a gas pressure in the chamber of greater than 5 mtorr as a $Cl_2$ and $C_2F_6$ content to the Ar content is 30–40%.

13. A method for manufacturing a ferroelectric thin-film capacitor comprising the steps of:
   (a) providing a chamber;
   (b) providing means for generating magnetic field, wherein said means surrounds said chamber;
   (c) providing a substrate holder in said chamber;
   (d) mounting a ferroelectric capacitor on said substrate holder, said ferroelectric capacitor comprising a Si substrate, a $SiO_2$ layer formed on said Si substrate, a lower Pt electrode formed on said $SiO_2$ layer, a lower oxide electrode on said lower Pt electrode, a ferroelectric layer formed on said lower oxide electrode, an upper oxide electrode formed on said ferroelectric layer, an upper Pt electrode formed on said upper oxide electrode, and a patterned photoresist mask formed on said upper Pt electrode;

(e) sealing and evacuating said chamber sequentially;

(f) inserting Ar, chloric and fluoric gases into said chamber;

(g) applying a first RF power to means for generating magnetic field, for generating plasma in said chamber; and (h) etching a part of ferroelectric capacitor by using said plasma, which is not covered with said pattered photoresist mask.

14. A method for manufacturing a ferroelectric thin-film capacitor as claimed in claim 13, wherein at least one of said lower and upper oxide electrodes includes $RuO_x$ as a main component thereof.

15. A method for manufacturing a ferroelectric thin-film capacitor as claimed in claim 1, wherein the density of said plasma is greater than $10^{11}/cm^3$.

16. A method for manufacturing a ferroelectric thin-film capacitor as claimed in claim 13, wherein the etching conditions of at least one of said Pt electrode are: a power of the RF coil of greater than 600 W, a DC self bias voltage of greater than 300 V, and a gas pressure in the chamber of less than 5 mtorr as a $Cl_2$ and $C_2F_6$ content to the Ar content is 0–10%.

17. A method for manufacturing a ferroelectric thin-film capacitor as claimed in claim 13, wherein the etching conditions of said ferroelectric thin-film capacitor are: a power of a RF coil of less than 600 W, a DC self bias voltage of less than 500 V, and a gas pressure in the chamber of greater than 5 mtorr as a $Cl_2$ and $C_2F_6$ content to the Ar content is 30–40%.

18. A method for manufacturing a ferroelectric thin-film capacitor as claimed in claim 7, wherein said ferroelectric thin-film is made of PZT.

19. A method for manufacturing a ferroelectric thin-film capacitor as claimed in claim 12, wherein said ferroelectric layer is made of PZT.

20. A method for manufacturing a ferroelectric thin-film capacitor as claimed in claim 17, wherein said ferroelectric layer is made of PZT.

21. A method for manufacturing a ferroelectric thin-film capacitor as claimed in claim 8, wherein said ferroelectric thin-film capacitor further includes a Ti adhesion layer between $SiO_2$ and said lower Pt electrode.

* * * * *

UNITED STATES PATENT AND TRADEMARK OFFICE
CERTIFICATE OF CORRECTION

PATENT NO. : 5,658,820
DATED : August 19, 1997
INVENTOR(S) : Chee-won Chung

It is certified that error appears in the above-identified patent and that said Letters Patent is hereby corrected as shown below:

Col. 5, line 38, change "At" to --Ar--.

Signed and Sealed this

Tenth Day of November 1998

Attest:

BRUCE LEHMAN

*Attesting Officer*　　　　*Commissioner of Patents and Trademarks*